United States Patent
Le et al.

(10) Patent No.: US 6,671,180 B2
(45) Date of Patent: *Dec. 30, 2003

(54) DEVICE RETENTION APPARATUS

(75) Inventors: Bao Gia Le, Orange, CA (US); Derek Nguyen, San Clemente, CA (US); David R. Davis, Jefferson, SD (US); Allan L. Klink, Sioux City, IA (US)

(73) Assignee: Gateway, Inc., Poway, CA (US)

(*) Notice: Subject to any disclaimer, the term of this patent is extended or adjusted under 35 U.S.C. 154(b) by 157 days.

This patent is subject to a terminal disclaimer.

(21) Appl. No.: 10/028,229

(22) Filed: Oct. 22, 2001

(65) Prior Publication Data

US 2002/0044427 A1 Apr. 18, 2002

Related U.S. Application Data

(63) Continuation-in-part of application No. 09/583,112, filed on May 25, 2000, now Pat. No. 6,456,489.

(51) Int. Cl.[7] .................................................. H05K 7/16
(52) U.S. Cl. ...................................................... 361/726
(58) Field of Search ................................ 361/685, 683, 361/686, 684, 724–727; 312/332.1, 333, 223.2; 439/483, 157, 152, 155, 159, 484

(56) References Cited

U.S. PATENT DOCUMENTS

| | | | |
|---|---|---|---|
| 4,979,909 A | * 12/1990 | Andrews | .................... 361/685 |
| 5,067,041 A | * 11/1991 | Cooke et al. | ................ 361/685 |
| 5,564,804 A | * 10/1996 | Gonzalez et al. | ........ 312/223.2 |
| 5,680,293 A | 10/1997 | McAnally et al. | |
| 5,921,644 A | * 7/1999 | Brunel et al. | ............ 312/223.2 |
| 6,025,987 A | 2/2000 | Allirot et al. | |
| 6,098,940 A | 8/2000 | Jacquemin | |
| 6,141,222 A | 10/2000 | Toor et al. | |
| 6,157,540 A | 12/2000 | Eddings et al. | |

* cited by examiner

Primary Examiner—Lisa Lea-Edmonds
(74) Attorney, Agent, or Firm—Scott Charles Richardson; Chad W. Swantz; Suiter-West

(57) ABSTRACT

The present invention is directed to a device retention apparatus. A method of retaining an electronic device in a housing may include engaging a first device side of an information handling system device against a first housing side of a housing suitable for retaining an information handling system device. The housing includes the first housing side, a second housing side, and a third housing side, wherein the second housing side is oriented generally opposing the first housing side, and the third housing side oriented is generally perpendicular to the first housing side and the second housing side. The information handling system device includes a first device side, a second device side, and a third device side. The information handling system device is rotated about the engaged portion of the information handling system device with the housing, so that the information handling system device is secured to the first housing side, second housing side and third housing side.

26 Claims, 14 Drawing Sheets

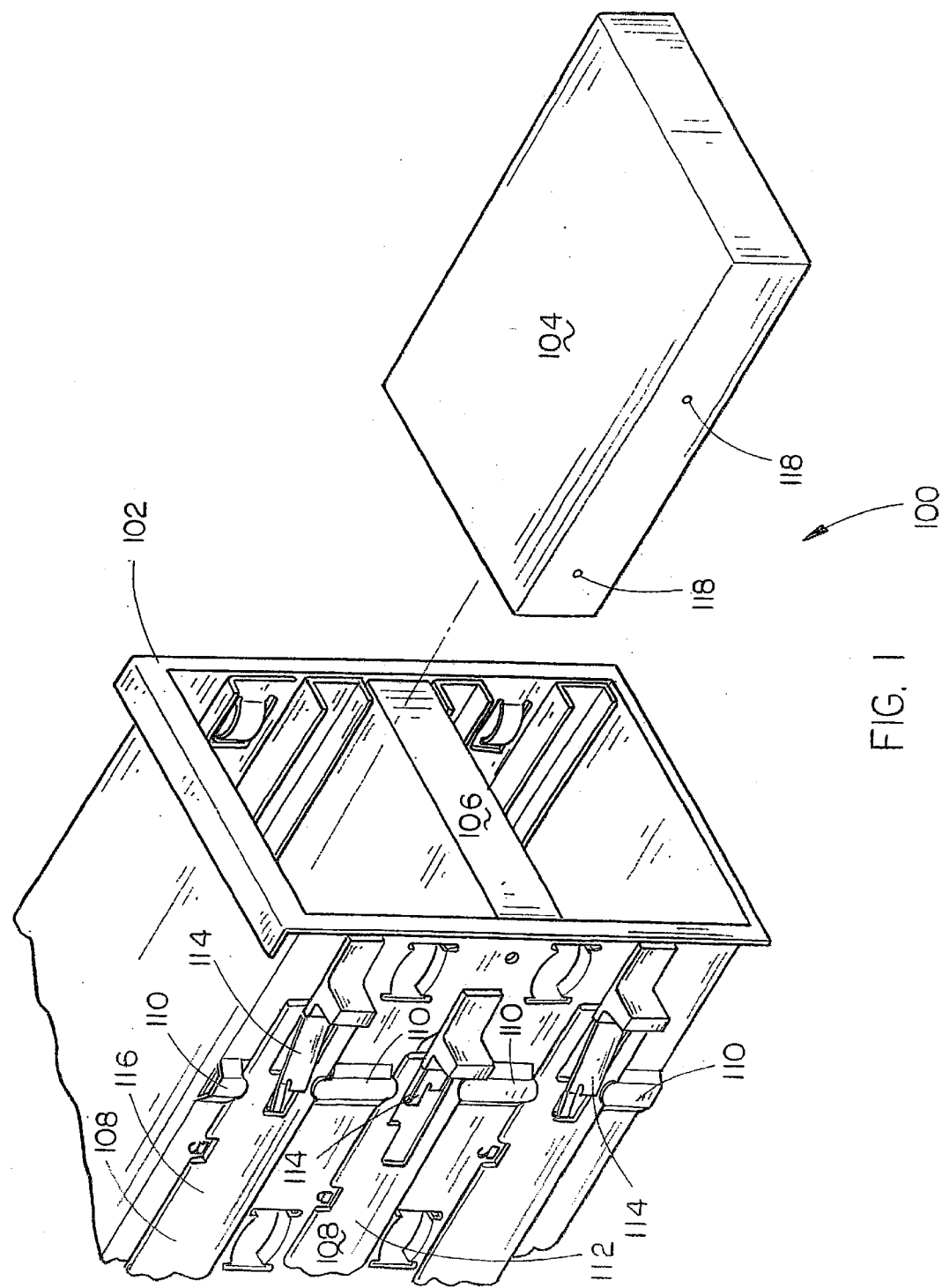

DEVICE RETENTION APPARATUS

CROSS REFERENCE TO RELATED APPLICATIONS

The present invention claims priority under 35 U.S.C. §120 as a continuation-in-part of U.S. patent application Ser. No. 09/583,112, *Device Retention Apparatus*, by David R. Davis et. al, filed May 25, 2000, now issued as U.S. Pat. No. 6,456,489, which is incorporated by reference in its entirety.

FIELD OF THE INVENTION

The present invention generally relates to the field of mounting devices for information handling system devices, and particularly to a device retention apparatus.

BACKGROUND OF THE INVENTION

The manufacture and assembly of information handling systems has become increasingly more competitive. Manufacturers continually strive to improve the design and features of information handling systems yet still offer competitive prices. One such area of improvement is in the mounting of devices in an information handling system. An information handling system, such as a typical desktop system, tower, server, and the like, may include information handling system devices, such as disk drives, compact disk read-only memories (CD-ROMs), digital video disc (DVD) players, floppy drives, and the like. These devices are typically added to increase the functionality of the information handling system as may be desired by a user. However, the installation of these devices in the information handling system may be very labor intensive.

For instance, the installation of a hard disk drive in an information handling system may involve the use of screws, typically four, to attach the drive to a housing included in the system. Typically, these screws are small making them difficult to manipulate and install. Additionally, because of their small size, the screws may be dropped by an assembler, possibly causing damage to the information handling system due to shorts, lodging in moving parts, and the like. Moreover, information handling systems have become increasingly smaller and smaller. With this smaller size comes a correspondingly lack of space, thus making it even more difficult to mount devices in an information handling system.

Further, the upgrade and repair of information handling system devices has become increasingly complicated. For example, a user may wish to add a larger hard drive, a digital video disk (DVD) player, and the like to an information handling system. However, the removal of an old device may require the user to remove a plurality of screws to release the old device and the installation of additional screws to install the new device. This may require a significant amount of time, as well as result in a loss of components, such as the screws and other attaching hardware.

Therefore, it would be desirable to provide an improved device retention apparatus.

SUMMARY OF THE INVENTION

Accordingly, the present invention is directed to a device retention apparatus. In a first aspect of the present invention a device retention apparatus includes a housing, a retaining portion and a selection mechanism. The housing includes a first side, a second side, and a third side, wherein the second side is oriented generally opposing the first side, and the third side oriented is generally perpendicular to the first side and the second side. The retaining portion is disposed on the housing, the retaining portion suitable for engaging an information handling system device when disposed in the housing. The selection mechanism is slideably connected to the housing so as to be capable of moving between a first position and a second position. As the selection mechanism is moved from the first position to the second position, the selection mechanism contacts the retaining portion thereby securing the information handling system device to the housing, the information handling system device engaging the first side of the housing, the second side of the housing, and the third side of the housing.

In a second aspect of the present invention, a device retention apparatus includes a housing and an information handling system device. The housing includes a first housing side, a second housing side, and a third housing side. The second housing side is oriented generally opposing the first housing side, and the third housing side oriented is generally perpendicular to the first housing side and the second housing side. The housing includes a first housing securing segment disposed on the first side, a second housing securing segment included on the second side, and a third housing securing segment included on the third side. The information handling system device includes a first device side, a second device side, and a third device side. The information handling system device further includes a first device securing segment disposed on the first side, a second device securing segment included on the second side, and a third device securing segment included on the third side. The information handling system device is suitable for installation into the housing by contacting the first housing securing segment with the first device securing segment and rotating the device so that the second housing securing segment contacts the second device securing segment and the third housing securing segment contacts the third device securing segment, thereby securing the information handling system device to the housing.

In a third aspect of the present invention, a method of retaining an electronic device in a housing includes engaging a first device side of an information handling system device against a first housing side of a housing suitable for retaining an information handling system device. The housing includes the first housing side, a second housing side, and a third housing side, wherein the second housing side is oriented generally opposing the first housing side, and the third housing side is oriented generally perpendicular to the first housing side and the second housing side. The information handling system device includes a first device side, a second device side, and a third device side. The information handling system device is rotated about the engaged portion of the information handling system device with the housing, so that the information handling system device is secured to the first housing side, second housing side and third housing side.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is an isometric drawing of an exemplary embodiment of the present invention wherein a device retention apparatus is utilized to secure and unsecure an information handling system device;

DETAILED DESCRIPTION OF THE INVENTION

Figure 2A:
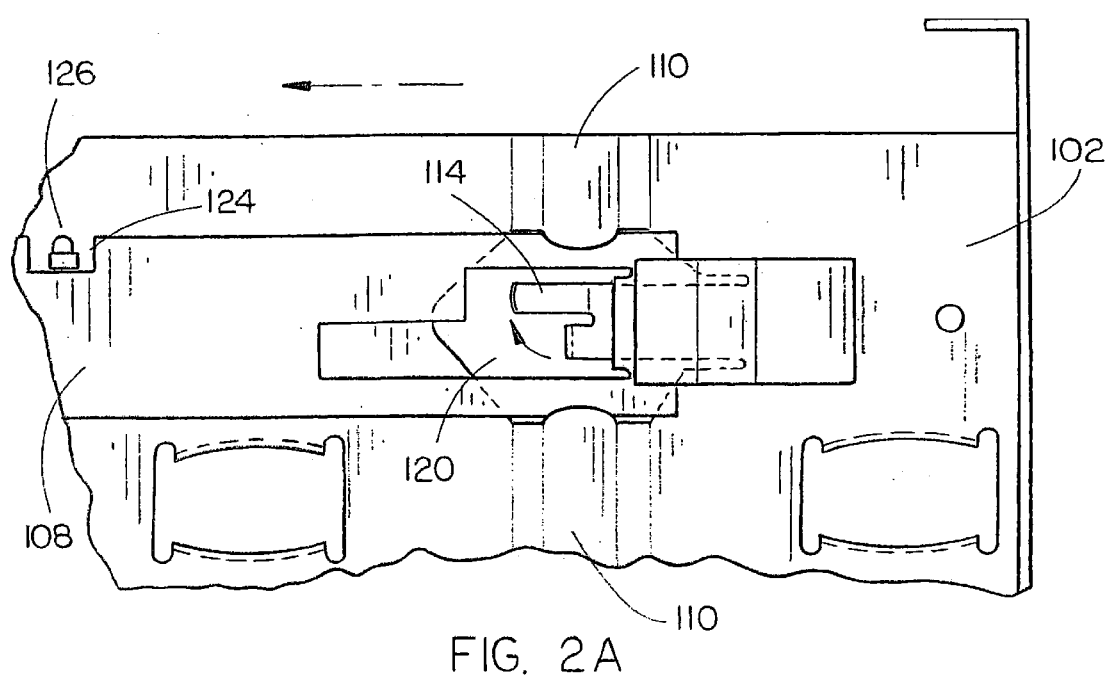
FIG. 2A depicts a side view of the exemplary embodiment depicted in FIG. 1 wherein a device retention apparatus is operated to secure a device.

Reference will now be made in detail to the presently preferred embodiments of the invention, examples of which are illustrated in the accompanying drawings.

Referring generally now to FIGS. 1 through 10B, exemplary embodiments of the present invention are shown. Information handling systems, such as desktop computers, tower systems, convergence systems, servers, and the like, may be complicated to manufacture and update. To install and remove information handling system devices, such as compact disk read-only memories (CD-ROM), digital versatile disc (DVD), disk drive such as a hard disk, floppy disk, floppy/optical disk, and the like, typically required a time consuming effort to install and replace.

For example, if a user wished to update a device, such as by installing a larger hard disk drive, the user had to engage in a time consuming process performed in the limited confines of an information handling system chassis. The present invention addresses these problems by proving a mounting assembly that is capable of easy operation by a user, thereby permitting faster installation and removal of information handling system devices in a more secure manner.

Referring now to FIG. 1, an exemplary embodiment of the present invention is shown. A device retention assembly 100 may include a housing 102 suitable for mounting information handling system devices 104 and 106. A selection mechanism 108 is disposed on the housing 102 so as to be capable of slideable movement, which may be achieved through the use of brackets 110 which secure the selection mechanism 108 to the housing 102. The brackets 110 permit the selection mechanism 108 to slide to a first position 112 wherein the selection mechanism 108 contacts a retaining portion 114 thereby securing the device 106 to the housing 102. The brackets 110 may also permit the selection mechanism 108 to slide to a second position 116 wherein the selection mechanism 108 contacts the retaining portion 114 so as to permit removal of the device 104 from the housing 102.

The retaining portion 114 may be formed so as to be suitable for engaging mounting holes 118 disposed on the device 118. Although the use of brackets for sliding the selection mechanism 108 is shown, it should be apparent that a person of ordinary skill in the art may select from a variety of methods and apparatus to permit movement of the selection mechanism without departing from the spirit and scope of the present invention.

Referring now to FIG. 2A, a side view of the exemplary embodiment depicted in FIG. 1 is shown wherein the device retention apparatus is operated to secure a device. A device retention apparatus may include a selection mechanism 108 disposed on a housing 102 wherein the selection mechanism 108 is capable of slideable movement along the housing 102 through the use of brackets 110. To secure a device 104 (FIG. 1) in the housing 102, the selection mechanism 108 may be moved thereby causing the selection mechanism 108 to engage a retaining portion 114, thereby forcing the retaining portion 114 toward the interior of the housing 102. In this way, the retaining portion 114 may engage a device 104 (FIG. 1) disposed in the housing 102 thus securing the device 104 (FIG. 1) to the housing 102. It may be preferable to include an aperture 120 in the selection mechanism 108 to permit the movement of the retaining portion 114 through the aperture 120, thereby increasing the range of motion of the retaining portion 114. A first edge portion 122 of the aperture 120 may then be utilized to contact the retaining portion 114 and thereby move the retaining portion 114 into a securing position.

It may also be preferable to include a viewing portion 124 as a part of the selection mechanism 108 to indicate the status of the mechanism 108. For example, when the selection mechanism 108 is in a secured state as shown in FIG. 2A, an opening 124 on the selection mechanism 108 may be used to view a securing indication disposed on the housing 102. Thus, a user may have an additional way of determining the state of the selection mechanism 108 as well as verification that the selection mechanism 108 is in a locked state.

Figure 2B:
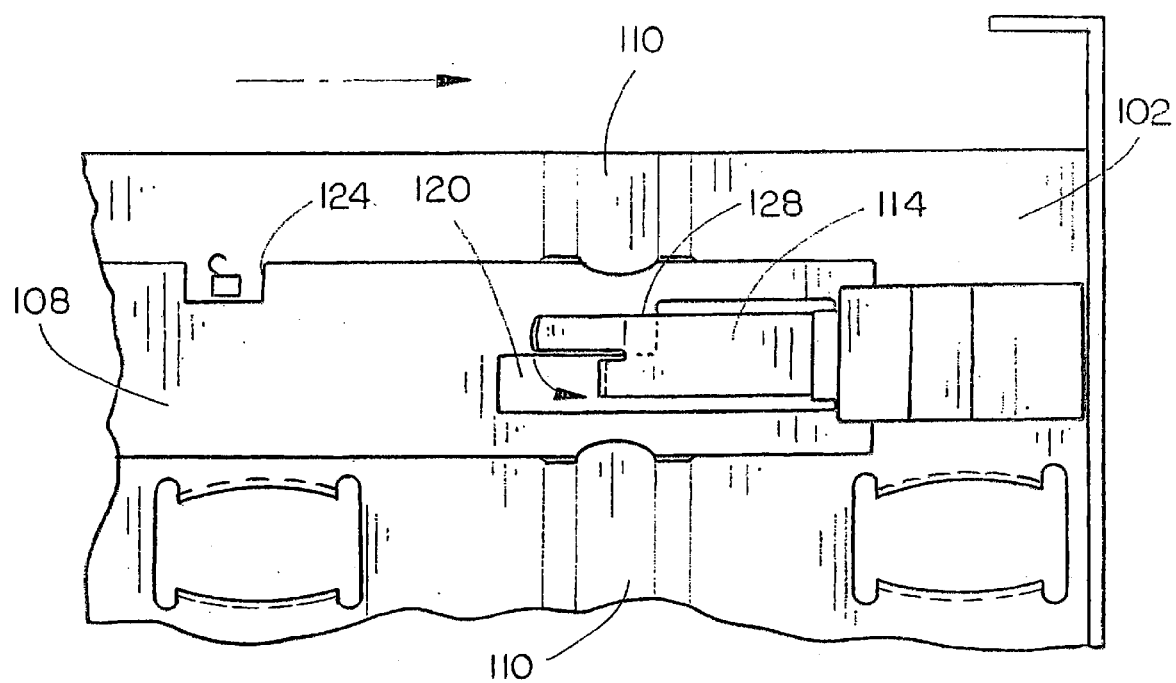
FIG. 2B illustrates a side view of the exemplary embodiment depicted in FIG. 1 wherein a device retention apparatus is operated to release a device.

Referring now to FIG. 2B, a side view of the exemplary embodiment depicted in FIG. 1 is shown wherein the device retention apparatus is operated to release a device. A device retention apparatus may include a selection mechanism 108 slideably mounted to a housing 102 with the use of brackets. To release a device 104 (FIG. 1) from the housing 102, the selection mechanism 108 may be moved to a second position so as to disengage the retaining portion 114 from the information handling system device 104 (FIG. 1) thereby permitting removal of the information handling system device from the housing 102. An aperture 120 may include a second edge portion 124 that may be utilized to contact the retaining portion 114 and thereby release the retaining portion 114. For example, the second edge portion 128 of the aperture 120 may lift the retaining portion 114 from a mounting hole 118 (FIG. 1) on a device 104 (FIG. 1) thereby permitting removal of the device 104 (FIG. 1) from the housing 102. In this way, a device may be removed from a housing in an improved manner without the necessity of tools and other labor and time intensive processes.

Figure 3A:
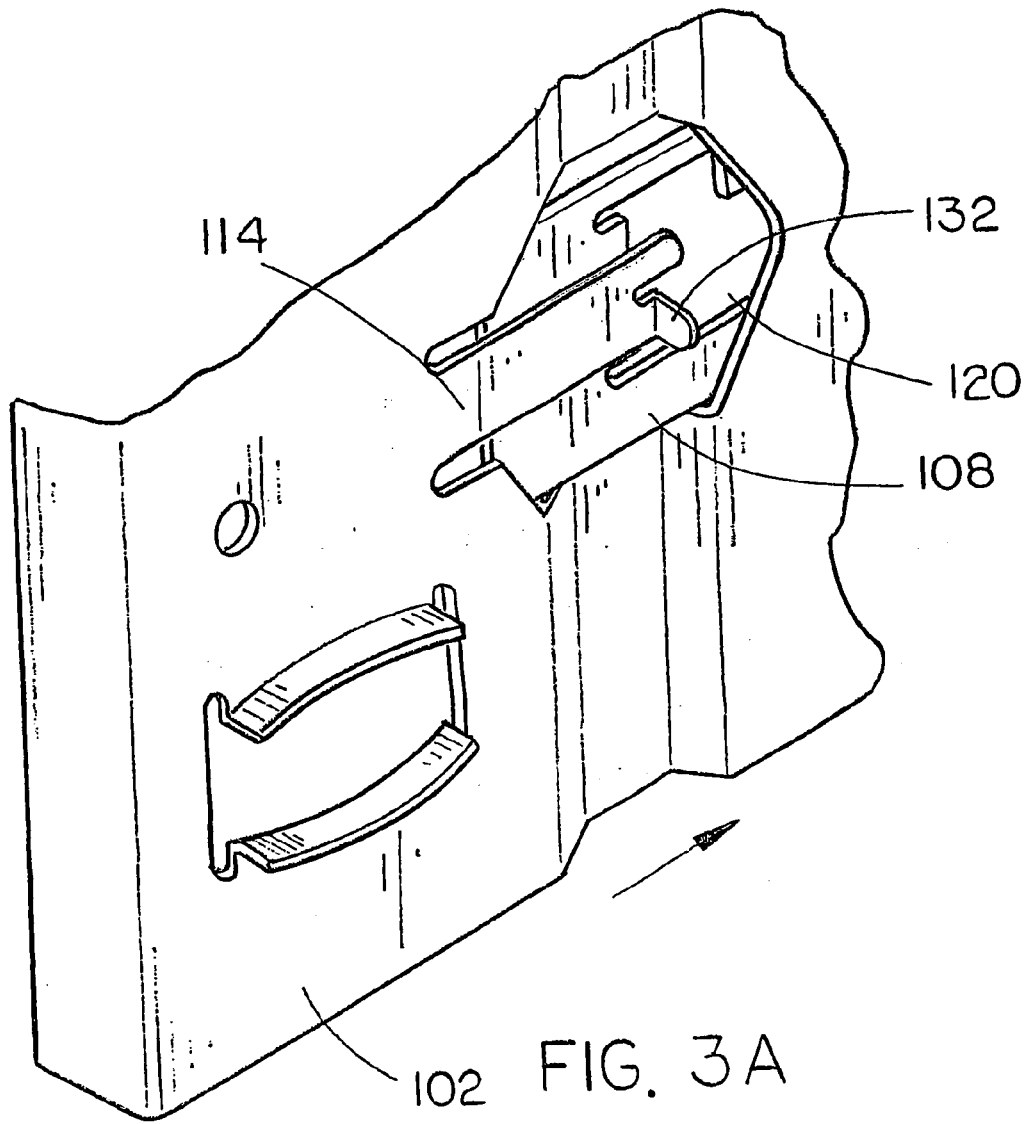
FIG. 3A is a magnified view of the exemplary embodiment as illustrated in FIG. 1 wherein a selection mechanism is utilized to move a retaining portion to a securing position.

Referring now to FIG. 3A, a magnified view of the exemplary embodiment illustrated in FIG. 1 is shown wherein a selection mechanism is utilized to move a retaining portion to a securing position. A housing 102 includes a retaining portion 114 formed as an integral part thereof. In this way, the retaining portion 114 and the housing 102 may be stamped from one piece of metal, thereby further saving time and expense both to manufacture and assemble. A selection mechanism 108 is disposed on the housing 102 and is capable of slideable movement as shown in FIGS. 2A and 2B. An aperture 120 disposed on the selection mechanism 108 enables the retaining portion 114 to operate through an increased range of motion.

Figure 3B:
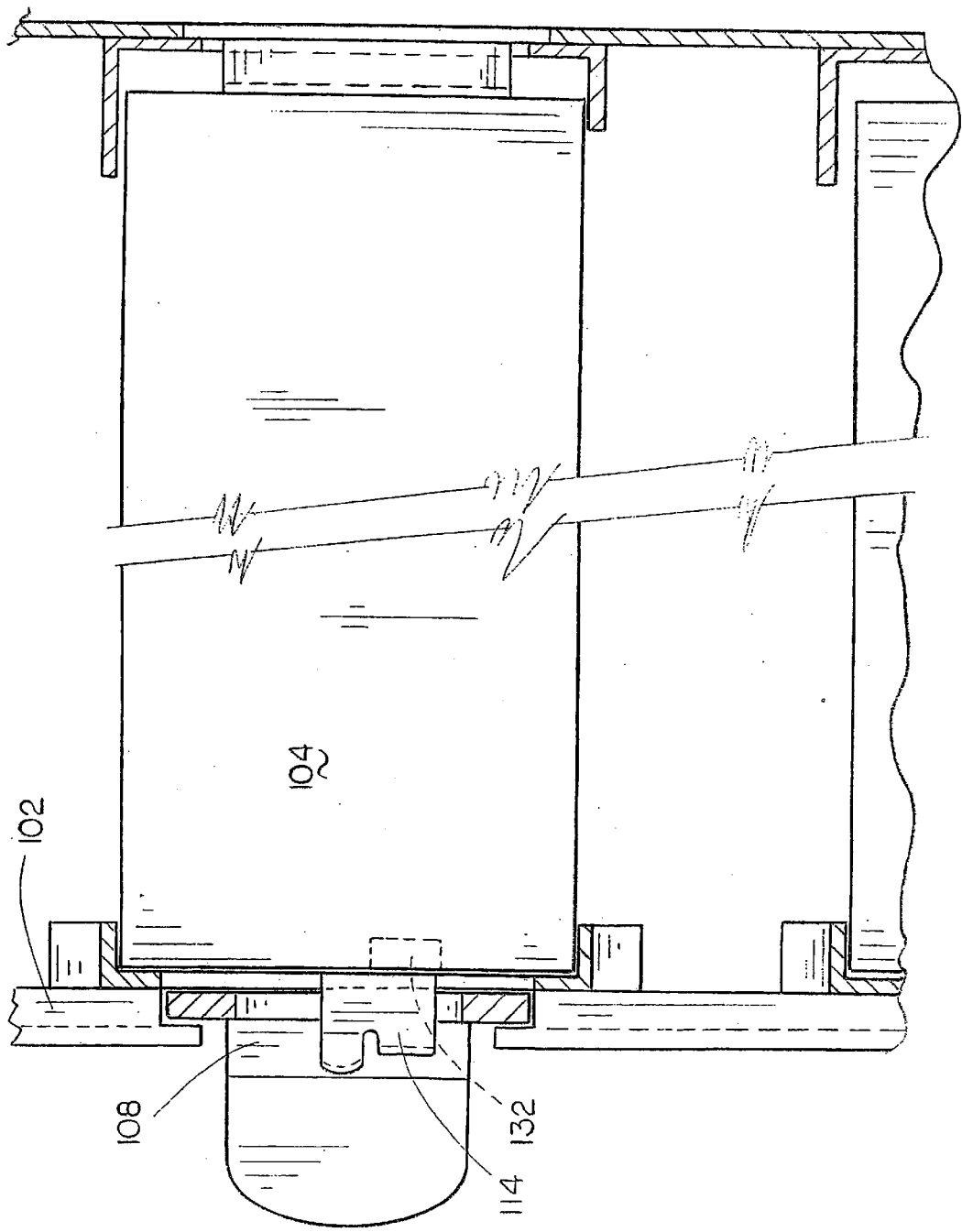
FIG. 3B is an end view of the exemplary embodiment as depicted in FIG. 3A wherein a selection mechanism is shown forcing a retaining portion into a device thereby securing the device to a housing.

As the selection mechanism 108 is moved to a securing position, a second edge portion 130 of the aperture 120 contacts the retaining portion 114 thereby forcing the retaining portion 114 toward the interior of the housing 102, and shown in FIG. 3B. Thus, a retaining tab 132 of the retaining portion 114 may engage an information handling system device 104 to secure the device 104 to the housing 102. By utilizing the selection mechanism 108 to move and secure the retaining portion 114, the retaining portion 114 need not be made of sprung steel, thus resulting in a further cost savings as cheaper grades of material may be utilized, such as metal, plastic, composites, and the like.

Figure 3C:
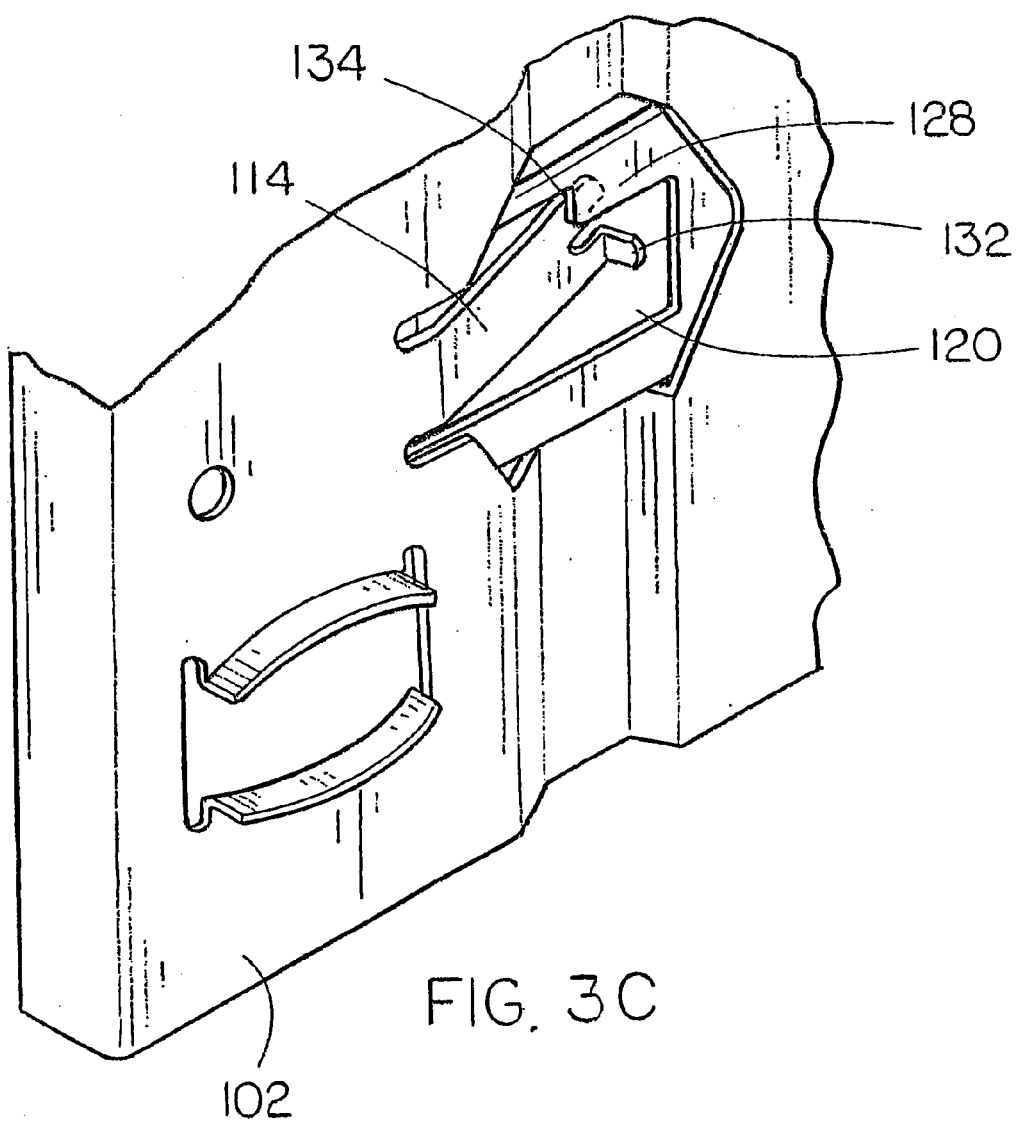
FIG. 3C is a magnified view of the exemplary embodiment as illustrated in FIG. 1 wherein a selection mechanism is utilized to move a retaining portion to release an information handling system device.

Referring now to FIG. 3C, a magnified view of the exemplary embodiment illustrated in FIG. 1 is shown wherein a selection mechanism is utilized to move a retaining portion to release an information handling system device. A housing 102 includes a retaining portion 114 formed as an integral part thereof. A selection mechanism 108 is disposed on the housing 102 and is capable of slideable movement as shown in FIGS. 2A and 2B. As the selection mechanism 108 is moved to release an information handling system device 104 (FIG. 1) from the housing 102, a first edge portion 126 of the aperture 120 contacts the retaining portion 114 thereby forcing the retaining portion 114 outward from the interior of the housing 102. The aperture 120 disposed on the selection mechanism 108 enables the retaining portion 114 to operate through an increased range of motion. Thus, a retaining tab 132 of the retaining portion 114 may be moved to a sufficient distance so as not to interfere with the insertion and removal of a device 104 (FIG. 1) from the housing 102.

It may also be preferable to include a lifting tab 134 suitable for contacting the second edge portion 128 thereby enabling increased reliability. For example, the lifting tab 134 may be formed to extend generally outward from the housing or device. Therefore, when the selection mechanism 108 is operated to release the device 104 (FIG. 1), the lifting tab 134 may aid in the removal of the retaining tab 132 from the device 104 (FIG. 1). Thus, the retaining portion 114 may be made of materials that do not have spring-like characteristics, instead the retaining portion may be operated through the movement of the selection mechanism 108.

Figure 4:
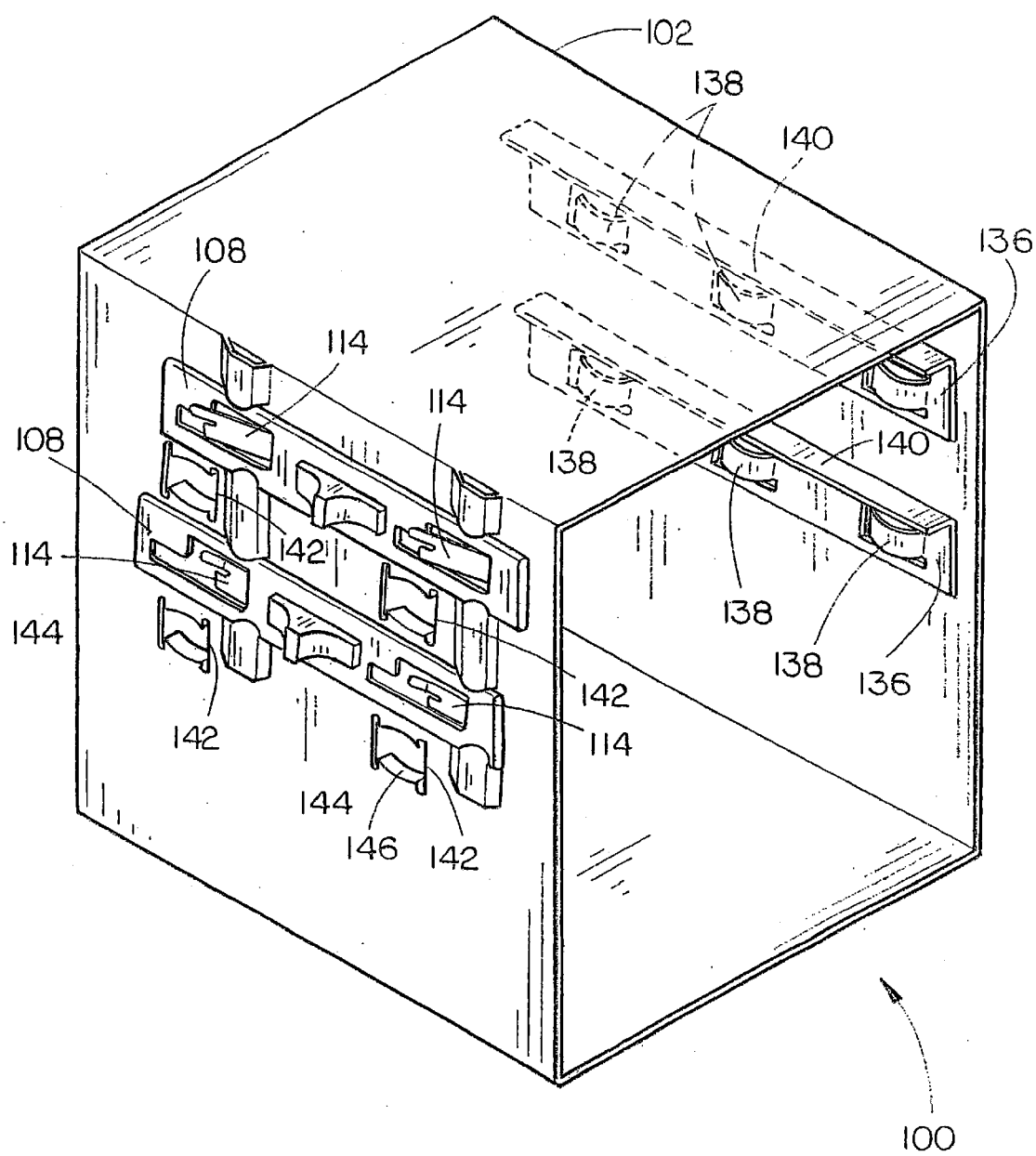
FIG. 4 depicts an exemplary embodiment wherein a device retention apparatus includes a biasing mechanism suitable for biasing a device toward a selection mechanism.

Referring now to FIG. 4, an exemplary embodiment is shown wherein a device retention apparatus includes a biasing mechanism suitable for biasing a device toward a selection mechanism. A device retention apparatus 100 may include a housing 102 suitable for mounting information handling system devices 104 and 106 (FIG. 1). Selection mechanisms 108 may be disposed on one side of the housing 102. Further, biasing mechanisms 136 may include springs 138 used to bias a device 104 (FIG. 1) inserted into the housing 102 toward the selection mechanism 108. In this way, a device may be further secured thus preventing rattling and other unwanted movement as well as encourage a more secure connection with the retaining portion 114.

Guides may also be provided to enable a device to slide along the housing in an improved manner. For example, a biasing mechanism 136 may include a rail 140 suitable for allowing a device to slide thereon. Further, guides may be formed as an integral part of the housing 102. For instance, guides 142 may be formed as a stamped portion of the housing 102 to permit a bottom of a device to slide along an upper portion 144 of the stamped guide 142. It may also be preferable to include a lower portion 146 so as to secure a top of a device to prevent unwanted movement when the device is inserted in the housing 102.

Figure 5:
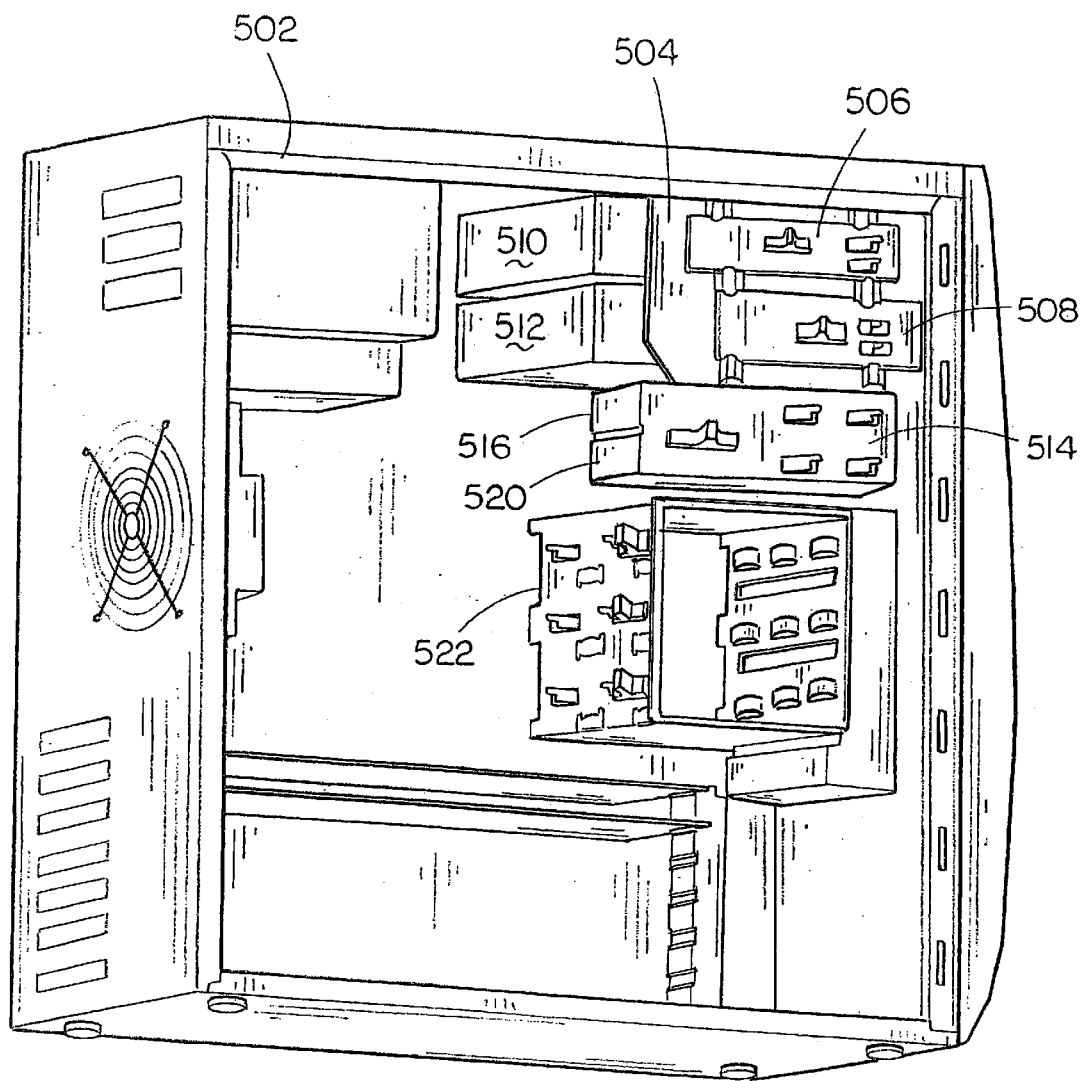
FIG. 5 illustrates an information handling system incorporating an exemplary device retention apparatus of the present invention.

A device retention apparatus may be oriented in a variety of ways and include a variety of sizes without departing from the spirit and scope of the present invention. For example, as shown in FIG. 5, an information handling system 500 formed as a tower unit is shown. The information handling system 500 includes a chassis 502 for housing various components and devices to protect the components from environmental and other potentially harmful influences. A first device retention apparatus 504 includes a first selection mechanism 506 and a second selection mechanism 508 for securing devices. The first device retention apparatus 504 is oriented in the case 502 so as to enable the insertion and removal of the devices 510 and 512 from the front of the case 502. This orientation may be preferable for removable media devices, such as compact disk read-only memories (CD-ROM), digital video disc (DVD) players, floppy drives, and the like, so as to enable a user to access the devices 510 and 512 when secured to the device retention apparatus 504. A selection mechanism 514 may also be formed to secure a plurality of devices 516 and 520 to a device retention apparatus 504.

Additionally, a device retention apparatus 522 may be oriented in a case 502 so as to secure traditional internal components that typically do not need to be frequently accessed by a user, such as hard drives and the like. For example, the device retention apparatus 522 may be oriented so as to secure devices in the internal portion of the case 502 but which may be accessed by a door disposed on the side of the case 502. It should be appreciated that a wide variety of sizes may be secured by the present invention and not depart from the spirit and scope thereof, such as 5¼ inch device, 3½ inch device, and the like.

Figure 6A:
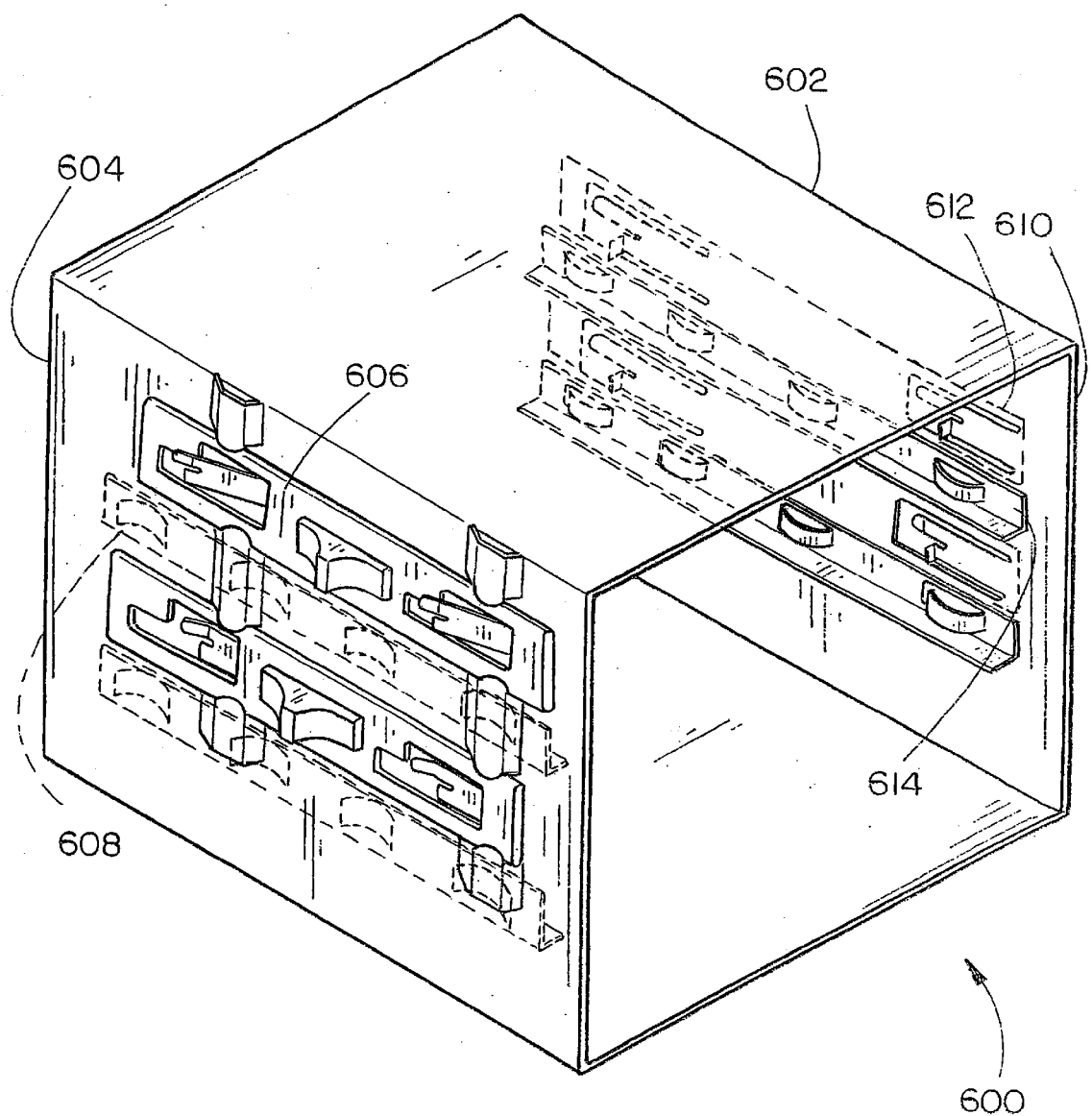
FIGS. 6A and 6B depict an additional exemplary embodiment of the present invention wherein a plurality of selection mechanisms and biasing mechanisms are shown.
Figure 6B:
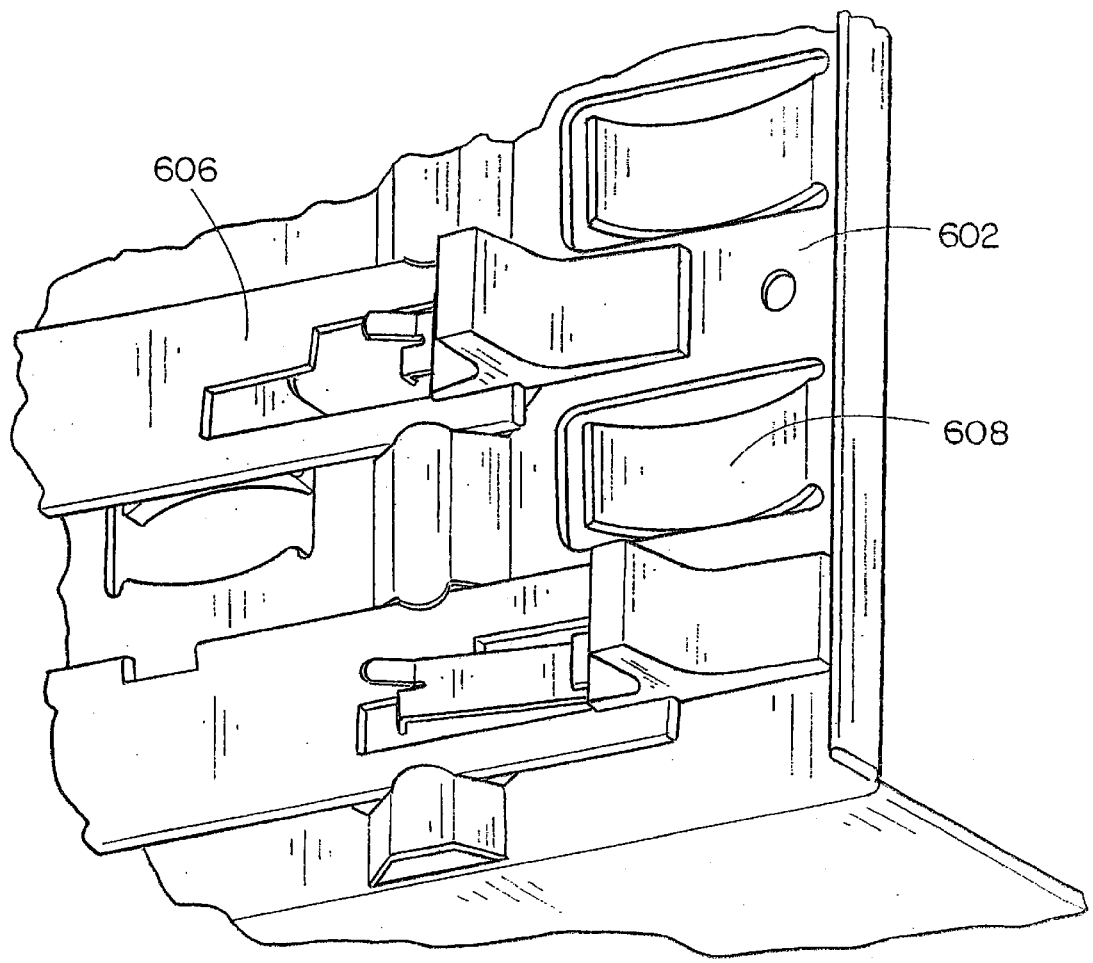

Referring now to FIGS. 6A and 6B, an additional exemplary embodiment of the present invention is shown. A device retention apparatus 600 includes a housing 602 for securing information handling system devices 104 and 106 (FIG. 1). A first side 604 of the housing 602 includes a selection mechanism 606 and a biasing mechanism 608. A second side 610 of the housing 602 also includes a selection mechanism 612 and a biasing mechanism 614. Thus, the device retention apparatus 600 is capable of securing a device on two opposing sides, thereby further securing the device. Additionally, the provision of two biasing mechanisms 608 and 614 further prevent unwanted movement of a device within the housing 602.

Figure 7:
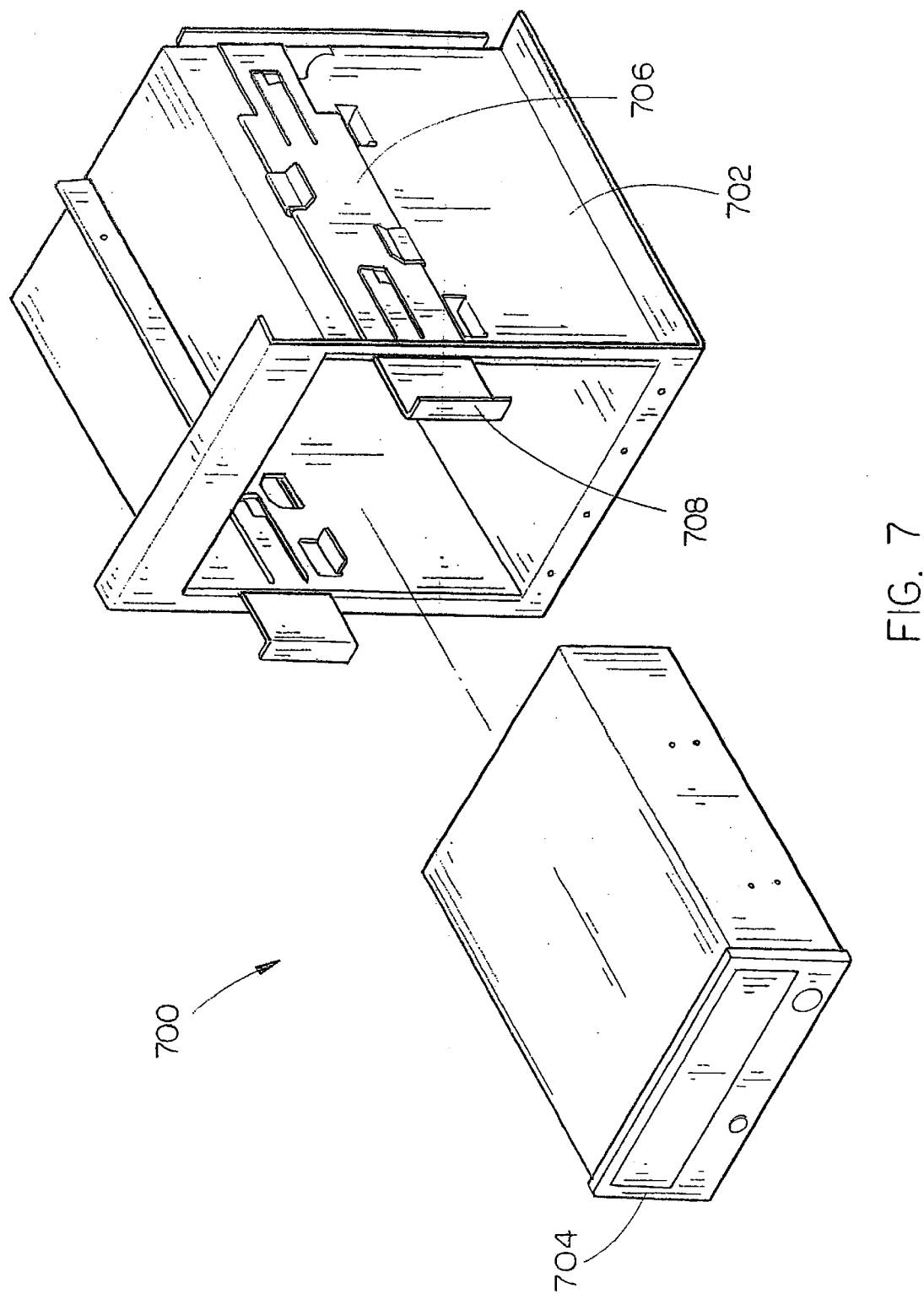
FIG. 7 illustrates an additional exemplary embodiment of the present invention wherein a device retention apparatus including a selection mechanism formed so as to extend outward from a front opening of a housing.

Referring now to FIG. 7, an additional exemplary embodiment of the present invention is shown. A device retention apparatus 700 includes a housing 702 for securing an information handling system device 704. The device retention apparatus 700 may also include a selection mechanism 706 disposed on the housing 702. The selection mechanism 706 may be formed so as to extend outward from the housing 702 so as to permit operation of the selection mechanism 706 from the front portion of the housing 702. For example, a handle 708 may be disposed on the front edge of the selection mechanism 706 to enable a user to grasp the handle 708 to secure and release the selection mechanism as previously described. Thus, the device retention apparatus may be operated without needing access to the devices from the side of the housing thereby permitting operation of the device retention apparatus in limited space environments.

Figure 8A:
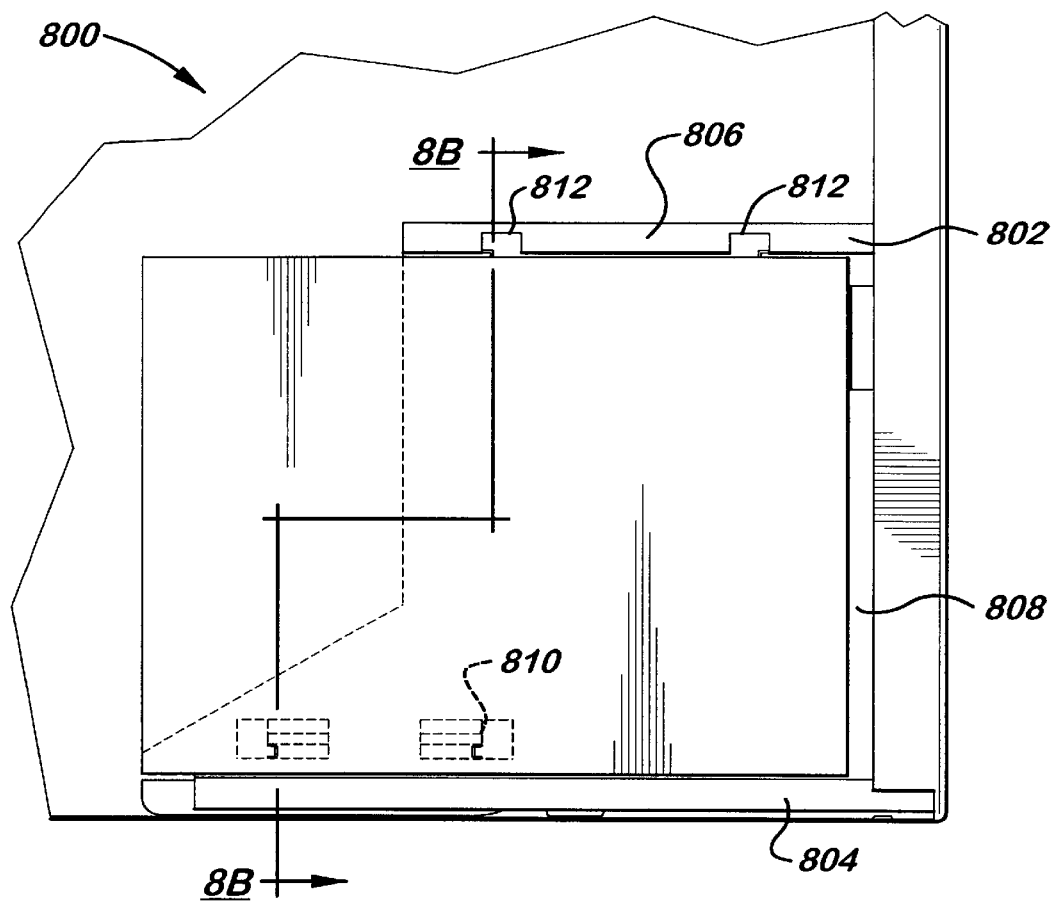
FIG. 8A is a top plan view of an embodiment of the present invention wherein a housing including securing segments on three sides is shown.

Referring now to FIG. 8A, an embodiment 800 of the present invention is shown wherein a device is secured to three sides of a housing to promote secure attachment. A housing 802, as shown in a top plan view, may include a first side 804, a second side 806 and a third side 808. The first side 804 and the second side 806 are generally opposing each other, and the third side 808 is oriented generally perpendicular to the first side and the second side. In this example, the first side 804 and the second sides 806 are generally longitudinal sides of the housing, while the third side 808 is configured for use as the top and/or bottom of the housing 802.

Securing segments may be provided to secure a device to the housing. The first side 804, the second side 806 and the third side 808 each include a securing segment to secure the device to the housing. A securing segment may be configured in a variety of ways as contemplated by a person of ordinary skill in the art without departing from the spirit and scope of the present invention. For example, a third securing segment 810, configured as a tab, suitable for engaging a receptacle on a device, may secure a third side of a device to the third side 808 of the housing. Second securing segment 812 may be configured as receptacles suitable for receiving tabs disposed on a device. It should be apparent that securing segments may be mounted in a variety of ways as contemplated by the present invention, such as tabs disposed on the device and/or housing, a retaining portion in conjunction with a selection mechanism as described earlier, and the like.

By providing securing portions on three of the four largest sides, based on at least one of area and dimension, the device may be protected against jarring and rattling during shipping, greatly increasing the durability of an information handling system including the device, and making the information handling system less prone to damage, thereby enabling manufacturers of the information handling system to offer the products cheaper.

Figure 8B:
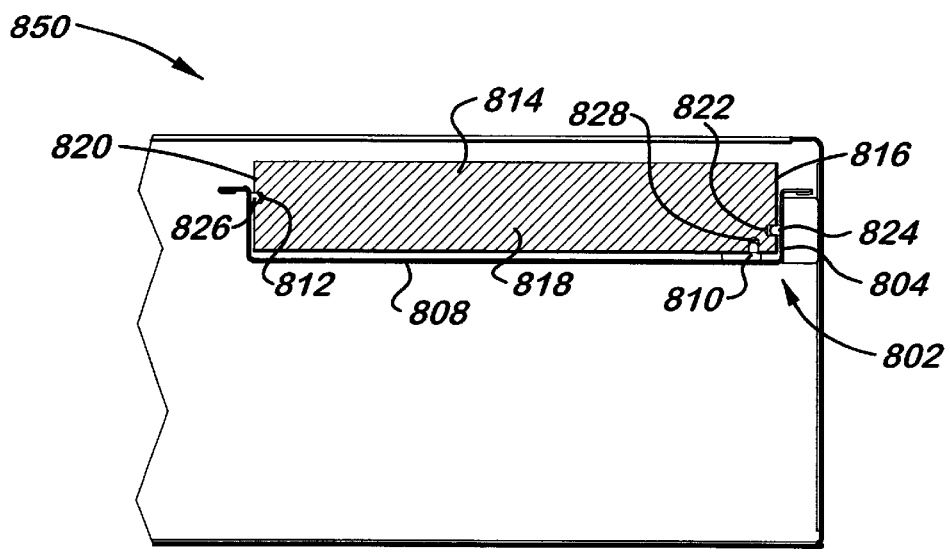
FIG. 8B is an end view of the embodiment depicted in FIG. 8A wherein a device is retained in a housing.

Thus, an information handling system device 814 may be securely mounted in a chassis 802, as shown in the embodiment 850 depicted in FIG. 8B. An information handling system device 814, such as a hard drive, optical media drive, floppy drive, electronic data storage device, and the like, may be configured to include a first side 816, second side 820 and a third side 818. Like the housing 802 as described previously, the first side 816 and the second side 820 may include the longitudinal sides of the device, while the third side 818 may include the top and/or bottom of the device 814. The three sides may include the largest sides of the device 814, as defined by area, dimension, such as length, width, and the like.

The information handling system device 814 may include securing segments to provide secure attachment of the device 814 to the housing 802. In this embodiment, the first securing segment 822 of the information handling system device 814 is configured as a receptacle suitable for receiving a first securing segment 824, configured as a tab, disposed on the first side 804 of the housing 802.

Additionally, a third securing segment 810 disposed on the third side 808 of the housing 802 is configured as a tab suitable for insertion into a receptacle, which in this instance is the third securing segment 828 of the device 814. The third securing segment 810 of the housing 802 is positioned on a side nearer the first side 804 of the housing 802, the side divided by a halfway point between the first side 804 and the second side 806 of the housing 802. In this way, additional securing of the device on a side away from the rotational point of the device, as will be described later in the detailed description, is provided.

A second securing segment 826, configured as a tab, is disposed on the second side 820 of the device 814. The second securing segment 826 of the device 814 engages a second securing segment of the housing 802, such as the receptacle 812 shown in FIG. 8A. To provide efficient insertion and promote secure installation, rotational installation and removal of the device may be provided by the present invention.

Figure 9A:
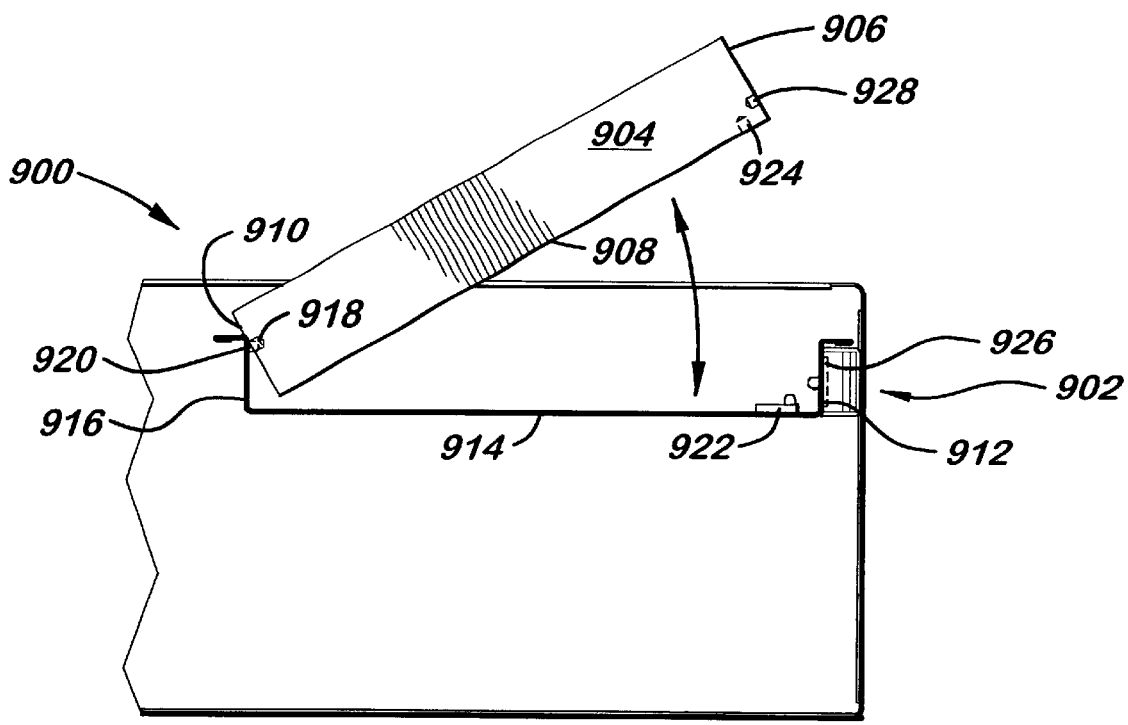
FIG. 9A is an end view of an embodiment of the present invention wherein a device is rotateable mounted to a housing.

For example, referring now to FIG. 9A, an embodiment 900 of the present invention is shown, wherein a device is rotateable installed into a housing of an information handling system. In this example, although top-mounted mounting of a device into a housing will be described, it should be apparent that removal of the device may be accomplished in a similar fashion. A housing 902 is configured to be suitable for receiving and securing a device 904. The device includes a first device side 906, a second device side 910 and a third device side 908. Likewise, the housing 902 includes a first housing side 912, a second housing side 916 and a third housing side 914.

Figure 9B:
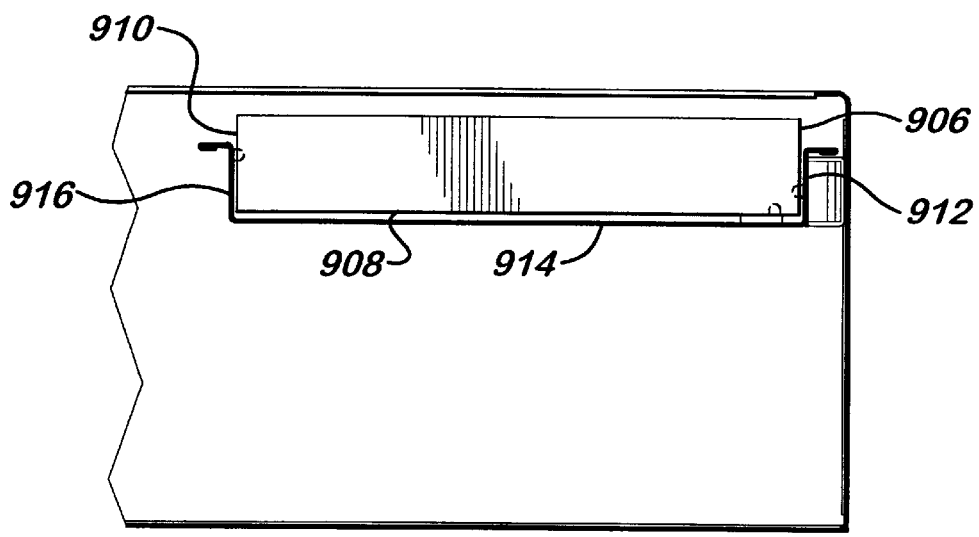
FIG. 9B is an illustration of an embodiment of the present invention wherein a device as shown in FIG. 9A is mounted to the housing.

A second device securing segment 918 disposed on the second device side 910 engages a second housing securing segment 920 disposed on the second housing side 916. The device 904 is rotated about the engaged segments 918 & 920 so that a third housing securing segment 922 disposed on the third side 914 of the housing 902 engages a third device securing segment 924 disposed on the third side 908 of the device 904. Additionally, a first device securing segment 928 disposed on the first side 906 of the device may be engaged by a first housing securing segment 926 included on the first side 912 of the housing 902. In this way, the first 906, second 910 and third 908 sides of the device 904 may be secured against the first 912, second 916 and third 914 sides of the housing 902 respectively, as shown in FIG. 9B, thereby providing increased securing over previous methods and apparatus.

Figure 10A:
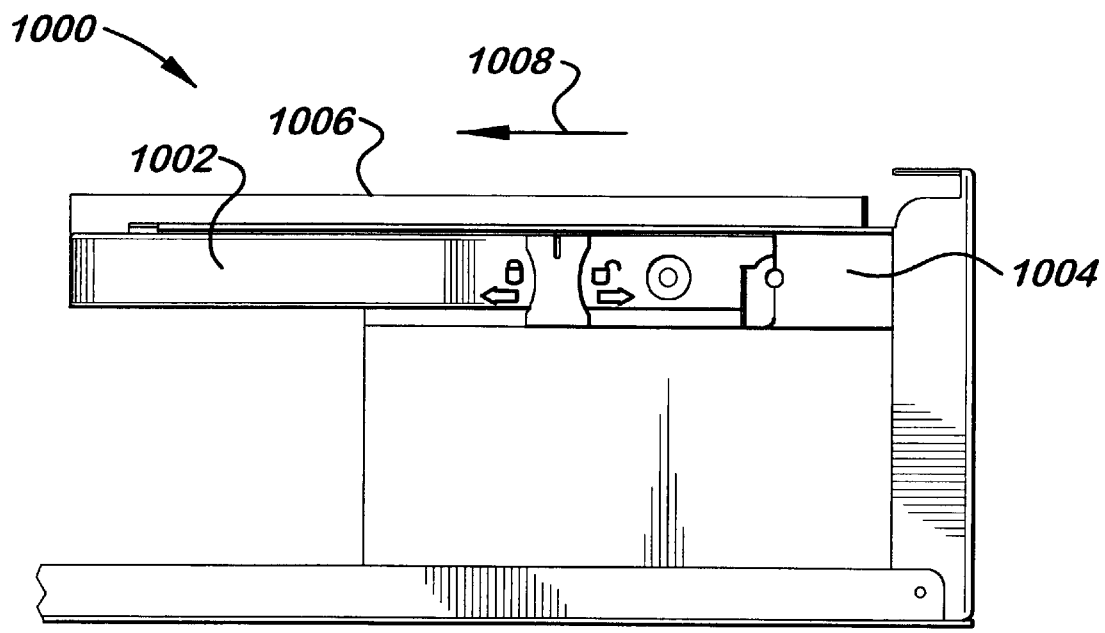
FIGS. 10A & 10B are side views of the embodiment depicted in FIG. 8A wherein a selection mechanism is shown.
Figure 10B:
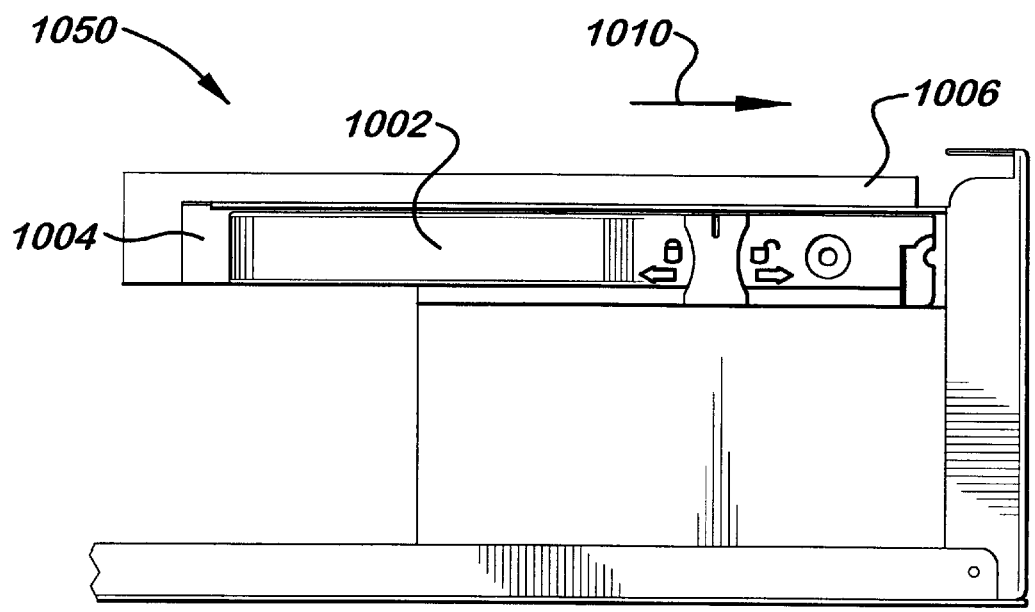

Further, it may be preferable to include a selection mechanism on a first side of the housing, as shown in the embodiments 1000 and 1050 depicted in FIGS. 10A and 10B. The selection mechanism 1002 is slideable mounted to a housing 1004. To release a device 1006 from the housing 1004, the selection mechanism 1002 may be moved to a first position 1008 so as to disengage the retaining portion 114 (FIG. 1) from the information handling system device 1006 thereby permitting removal of the information handling system device 1006 from the housing 1004.

To secure a device 1006 to the housing 1004, the selection mechanism 1002 may be moved to a second position 1010, as shown in FIG. 10B, so as to disengage the retaining portion 114 (FIG. 1) from the information handling system device 1006 thereby permitting removal of the information handling system device 1006 from the housing 1004.

It is believed that the device retention apparatus of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A device retention apparatus, comprising:

a housing including a first side, a second side, and a third side, wherein the second side is oriented generally opposing the first side, and the third side oriented is generally perpendicular to the first side and the second side;

a retaining portion disposed on the housing, the retaining portion suitable for engaging an information handling system device when disposed in the housing; and a selection mechanism suitable for securing an information handling system device to the housing, wherein the selection mechanism is slideably connected to the housing so as to be capable of moving between a first position and a second position so that as the selection mechanism is moved from the first position to the second position, the selection mechanism contacts the retaining portion thereby securing the information handling system device to the housing, the information handling system device engaging the first side of the housing, the second side of the housing, and the third side of the housing.

2. The device retention apparatus as described in claim 1, wherein a first securing segment is located on the second side of the housing, the first securing segment suitable for engaging a an information handling system device.

3. The device retention apparatus as described in claim 1, wherein a securing segment configured as a receptacle is located on the second side of the housing, the receptacle suitable for receiving a securing segment configured as a tab disposed on an information handling system device.

4. The device retention apparatus as described in claim 1, wherein the retaining portion is formed as an integral part of the housing.

5. The device retention apparatus as described in claim 1, further comprising when the selection mechanism is moved from the second position to the first position, the selection mechanism contacts the retaining portion so as to disengage the retaining portion from the information handling system device thereby permitting removal of the information handling system device from the housing.

6. The device retention apparatus as described in claim 4, wherein when the selection mechanism is placed in the second position, the retention portion is withdrawn thereby permitting at least one of insertion and removal of an information handling system device without interference from the retention portion.

7. A device retention apparatus, comprising:

a housing including a first housing side, a second housing side, and a third housing side, wherein the second housing side is oriented generally opposing the first housing side, and the third housing side oriented is generally perpendicular to the first housing side and the second housing side and wherein the housing includes a first housing securing segment disposed on the first side, a second housing securing segment included on the second side, and a third housing securing segment included on the third side; and an information handling system device, the information handling system device including a first device side, a second device side, and a third device side, wherein the information handling system device includes a first device securing segment disposed on the first side, a second device securing segment disposed on the second side, and a third device securing segment disposed on the third side;

wherein the information handling system device is suitable for installation into the housing by contacting the first housing securing segment with the first device securing segment and rotating the device so that the second housing securing segment contacts the second device securing segment and the third housing securing segment contacts the third device securing segment, thereby securing the information handling system device to the housing.

8. The device retention apparatus as described in claim 7, wherein at least one of the housing securing segments are configured as a tab and at least one of the device securing segments are configured as receptacles suitable for receiving the tab housing securing segments.

9. The device retention apparatus as described in claim 7, wherein at least one of the device securing segments are configured as a tab and at least one of the housing securing segments are configured as a receptacle suitable for receiving the tab device securing segments.

10. The device retention apparatus as described in claim 1, further comprising a retaining device.

11. The device retention apparatus as described in claim 10, wherein the retaining apparatus includes a retaining portion disposed on the housing, the retaining portion suitable for engaging an information handling system device when disposed in the housing; and a selection mechanism suitable for securing an information handling system device to the housing, wherein the selection mechanism is slideably connected to the housing so as to be capable of moving between a first position and a second position so that as the selection mechanism is moved from the first position to the second position, the selection mechanism contacts the retaining portion thereby securing the information handling system device to the housing.

12. The device retention apparatus as described in claim 11, further comprising when the selection mechanism is moved from the second position to the first position, the selection mechanism contacts the retaining portion so as to disengage the retaining portion from the information handling system device thereby permitting removal of the information handling system device from the housing.

13. The device retention apparatus as described in claim 12, wherein when the selection mechanism is placed in the second position, the retention portion is withdrawn thereby permitting at least one of insertion and removal of an information handling system device without interference from the retention portion.

14. A method of retaining an electronic device in a housing, comprising:

engaging a first device side of an information handling system device against a first housing side of a housing suitable for retaining an information handling system device, wherein the housing includes the first housing side, a second housing side, and a third housing side, wherein the second housing side is oriented generally opposing the first housing side, and the third housing side oriented is generally perpendicular to the first housing side and the second housing side, and wherein the information handling system device includes a first device side, a second device side, and a third device side; and rotating the information handling system device about the engaged portion of the information handling system device with the housing, so that the information handling system device is secured to the first housing side, second housing side and third housing side.

15. The method as described in claim 14, wherein the information handling system device includes a first device securing segment disposed on the first side, a second device securing segment included on the second side, and a third device securing segment included on the third side and wherein the housing includes a first housing securing segment disposed on the first side, a second housing securing segment included on the second side, and a third housing securing segment included on the third side.

16. The method as described in claim 15, wherein engaging includes mechanically connecting the second device securing segment to the second housing securing segment.

17. The method as described in claim 15, wherein at least one of the housing securing segments are configured as a tab and at least one of the device securing segments are configured as receptacles suitable for receiving the tab housing securing segments.

18. The method as described in claim 15, wherein at least one of the device securing segments are configured as a tab and at least one of the housing securing segments are configured as a receptacle suitable for receiving the tab housing securing segments.

19. The method as described in claim 14, further comprising manipulating a retaining device disposed on the first side of the housing, the retaining device suitable for securing the information handling system device to the housing.

20. The method as described in claim 19, wherein manipulating includes sliding a retaining device from a first release position in which the information handling system device may be removed from the housing to a second securing position in which the information handling system device is secured to the housing.

21. A device retention apparatus comprising:

a housing including a first side, a second side, and a third side, wherein the second side is oriented generally opposing the first side, and the third side oriented is generally perpendicular to the first side and the second side;

a means for retaining disposed on the housing, the retaining means suitable for engaging an information handling system device when disposed in the housing; and a means for selecting suitable for securing an information handling system device to the housing, wherein the selecting means is slideably connected to the housing so as to be capable of moving between a first position and a second position so that as the selecting means is moved from the first position to the second position, the selecting means contacts the retaining means thereby securing the information handling system device to the housing, the information handling system device engaging the first side of the housing, the second side of the housing, and the third side of the housing.

22. The device retention apparatus as described in claim 21, wherein a first securing segment is located on the second side of the housing, the first securing segment suitable for engaging a an information handling system device.

23. The device retention apparatus as described in claim 21, wherein a securing segment configured as a receptacle is located on the second side of the housing, the receptacle suitable for receiving a securing segment configured as a tab disposed on an information handling system device.

24. The device retention apparatus as described in claim 21, wherein the retaining means is formed as an integral part of the housing.

25. The device retention apparatus as described in claim 21, further comprising when the selecting means is moved from the second position to the first position, the selecting means contacts the retaining means so as to disengage the retaining means from the information handling system device thereby permitting removal of the information handling system device from the housing.

26. The device retention apparatus as described in claim 25, wherein when the selecting means is placed in the second position, the retaining means is withdrawn thereby permitting at least one of insertion and removal of an information handling system device without interference from the retaining means.

* * * * *